United States Patent [19]

Roberts et al.

[11] Patent Number: 5,079,440
[45] Date of Patent: Jan. 7, 1992

[54] APPARATUS FOR GENERATING COMPUTER CLOCK PULSES

[75] Inventors: Ben Roberts, Sunnyvale; Borys Senyk, San Jose, both of Calif.

[73] Assignee: Intel Corporation, Santa Clara, Calif.

[21] Appl. No.: 494,159

[22] Filed: Mar. 15, 1990

[51] Int. Cl.$^5$ ............................................... H03K 5/13
[52] U.S. Cl. ......................................... 307/269; 328/63
[58] Field of Search ..................... 307/269, 262, 265; 328/62, 63, 58, 72, 111, 112

[56] References Cited

U.S. PATENT DOCUMENTS

| | | | |
|---|---|---|---|
| 4,355,283 | 10/1982 | Ott | 307/265 |
| 4,527,075 | 7/1985 | Zbinden | 307/269 |
| 4,604,582 | 8/1986 | Strenkowski et al. | 328/55 |
| 4,816,700 | 3/1989 | Imel | 307/269 |
| 4,959,557 | 9/1990 | Miller | 307/269 |

Primary Examiner—Stanley D. Miller
Assistant Examiner—Sinh N. Tran
Attorney, Agent, or Firm—Blakely, Sokoloff, Taylor & Zafman

[57] ABSTRACT

A circuit for generating two clock pulse trains of opposite polarity to one another each at a frequency of a single input clock pulse train including a flip-flop for providing the two output clock pulse trains, apparatus for placing the flip-flop in a first condition in response to the input clock pulse train, apparatus for producing signals for placing the flip flop in a second condition in response to the input clock pulse train after a first delay, apparatus for producing signals after a second delay in response to the first delayed signals, apparatus for equating the delays so that the first half of each clock pulse is the same length as the second half, and apparatus for comparing the input pulse train to the pulse trains produced to increase the frequency of the output trains produced responsive to the detection of a subharmonic of the input frequency.

7 Claims, 4 Drawing Sheets

APPARATUS FOR GENERATING COMPUTER CLOCK PULSES

BACKGROUND OF THE INVENTION

1. Field of the Invention

This invention relates to computer circuits and, more particularly, to circuitry for generating computer system clock pulses.

2. History of the Prior Art

Typically, in prior art microprocessor-based computer systems, an input clock provided at a frequency controlled by a crystal oscillator is divided to provide symmetrical phase one and phase two clock pulses to operate the internal logic of the microprocessor. As the performance of microprocessor circuits has been pushed to ever higher frequencies, providing and distributing clock pulses resulting from a division by two of the crystal oscillator clock frequency has become more difficult. For example, a thirty-three MHz internal clock pulse requires an input clock frequency of sixty-six MHz from the crystal oscillator. Some of the system support logic has to operate at this sixty-six MHz frequency. Designing and manufacturing such circuitry is quite difficult and expensive. For this reason, it has been proposed that the frequency provided by the crystal oscillator be utilized as the frequency for the clock pulses for the internal logic.

However, it is also advantageous that the newer designs of circuitry be based wherever possible on designs already utilized. This allows the use of proven circuit designs which are known to operate in a particular manner without idiosyncrasies; and it shortens the design time and, consequently, lessens the cost of the circuitry. In order to utilize as much proven circuitry as possible, it is useful for a new microprocessor system derived from a family of microprocessors which have previously operated upon two opposite phase clock pulses for its internal logic to continue to function in the same manner. Normally, one would expect that simply buffering the input clock signal to generate the internal phase one and phase two signals would provide the required clock pulses. However, although the period of the clock cycle provided by a crystal clock oscillator may be very accurately determined, the duty cycle may not be so accurately determined. It has been found in practice that the duty cycle may vary by as much as five percent of the period leading to phase/time variations of up to ten percent. This variation can reduce the performance of the system by the same amount.

SUMMARY OF THE INVENTION

It is, therefore, an object of this invention to provide circuitry for furnishing clock pulses of the same frequency as those generated by the input clock oscillator.

It is another object of this invention to provide clock pulses of the same frequency as those provided by the input clock oscillator and having a duty cycle which is very accurately determined.

These and other objects of the invention are realized in a circuit for generating a pair of opposite-phase clock pulses at a frequency equal to an input frequency comprising a first flip-flop having set and reset terminals for producing the opposite phase clock pulses, means for furnishing pulses at the input frequency to one input terminal of the first flip-flop, a second flip-flop, means for furnishing pulses at the input frequency to one input terminal of the second flip-flop, a first timing circuit responsive to an output of the second flip-flop for initiating a timing sequence to provide a second input to the second flip-flop and a second input to the first flip-flop, a third flip-flop having an input responsive to the second input to the second flip-flop, a second timing circuit responsive to an output of the third flip-flop for initiating a timing sequence to provide a second input to the third flip-flop, means for comparing the length of similar output signals produced by the second and third flip-flops and varying the lengths of the timing sequences to be equal, means for detecting a subharmonic of the input frequency, and means responsive to the detection of a subharmonic of the input frequency for causing the means for comparing the similar output signals produced by the second and third flip-flops and varying the lengths of the timing sequences to be equal to vary the lengths of the timing sequences to increase the frequency of output produced by the first flip-flop.

These and other objects and features of the invention will be better understood by reference to the detailed specification which follows taken together with the drawings in which like designations are used to refer to like elements throughout the several views.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus for operating a computer in processing electrical or other (e.g. mechanical, chemical) physical signals to generate other desired physical signals.

DETAILED DESCRIPTION OF THE INVENTION

Figure 1:
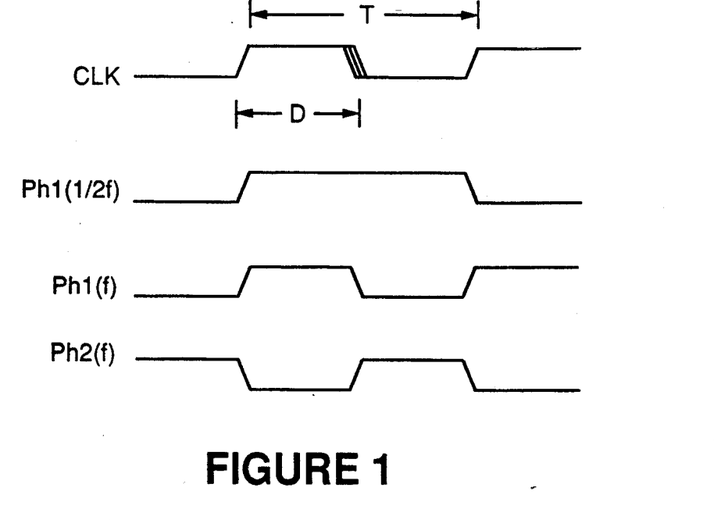
FIG. 1 illustrates a timing diagram useful in describing the problems arising from generating clock pulses at the frequency provided by an input crystal oscillator.

Referring now to FIG. 1 there is shown a timing diagram illustrating the problems arising from generating clock pulses at the frequency provided by a crystal oscillator. The timing diagram illustrates the crystal oscillator input signal CLK, a phase one pulse generated from the crystal oscillator input signal at one-half of the crystal oscillator frequency Ph1 ($\frac{1}{2}$ F), and phase one and phase two clock pulses generated at the crystal oscillator frequency Ph1 (F) and Ph2 (F).

In FIG. 1, the period T of the oscillator pulse and the length of the duty cycle are illustrated. The period T of the oscillator pulse may be very accurately controlled while the length D of the duty cycle of that pulse may not be so accurately controlled. The inability to control the length of the duty cycle is due to the inability to control the exact point at which the clock pulse falls in its swing from the positive half cycle to the negative half cycle. It has been found that this point may vary by approximately five percent of the period T. In prior art arrangements which have been able to utilize phase one and phase two clock pulses of half the frequency of the input oscillator (such the pulse Ph1 ($\frac{1}{2}$ F)), the duty cycle may be very accurately controlled because it is measured between the beginning and end of the accurately controlled period T of the input pulse furnished by the crystal oscillator. On the other hand, where the clock pulses to be generated extend from the rising edge of the input clock frequency signal to the falling edge of that signal (as with the last two clock pulses Ph1 (F) and Ph2 (F)), the pulses may not be precisely determined. In fact, the length of a pulse targeted to be fifty percent of the duty cycle of the input clock frequency may vary by five percent of the total period T of the input clock frequency and thus by ten percent of the length of the duty cycle.

Figure 2A:
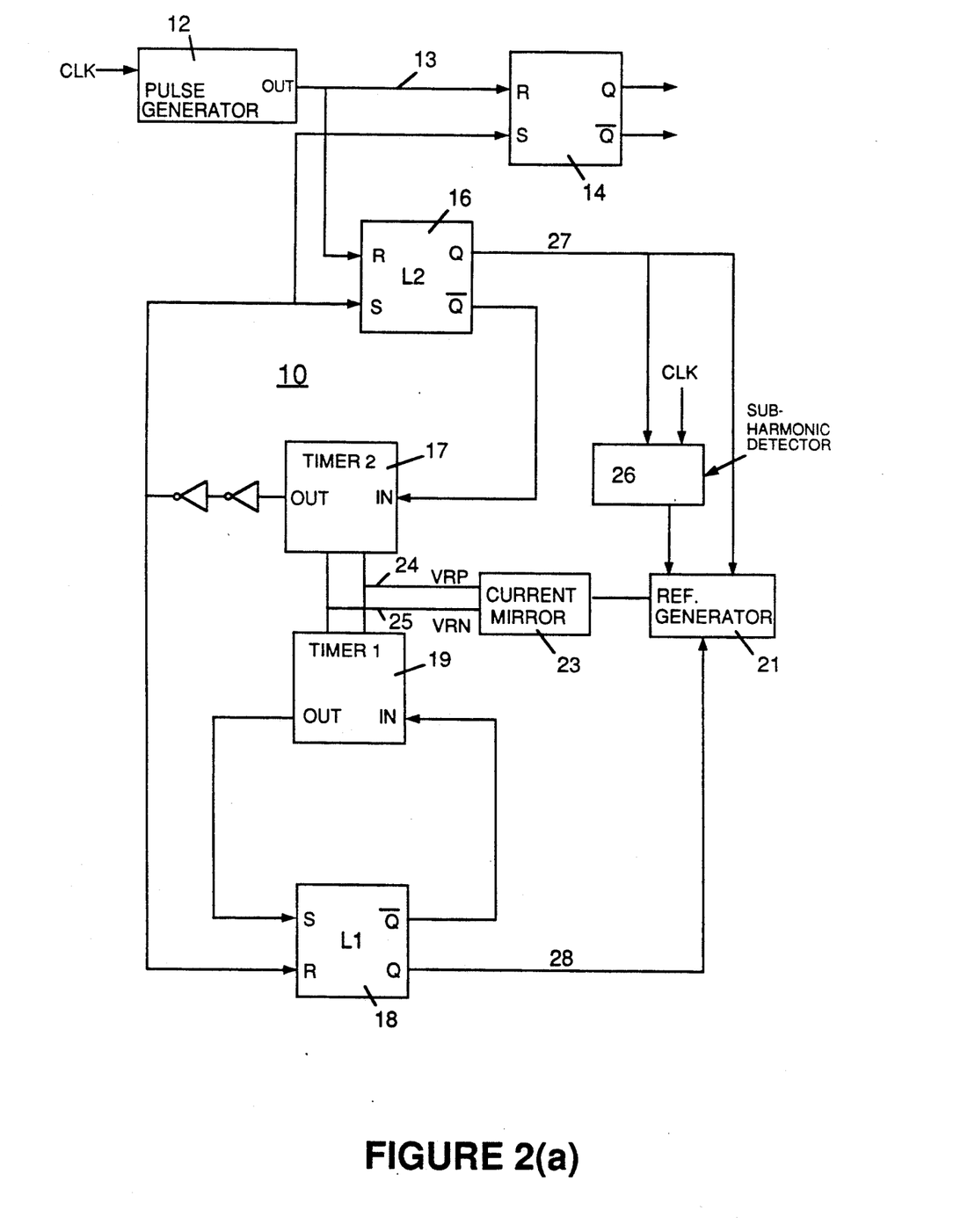
FIG. 2(a) illustrates a circuit in accordance with the invention which may be utilized to improve the accuracy of phase one and phase two clock pulses generated at a crystal oscillator frequency.
Figure 2B:
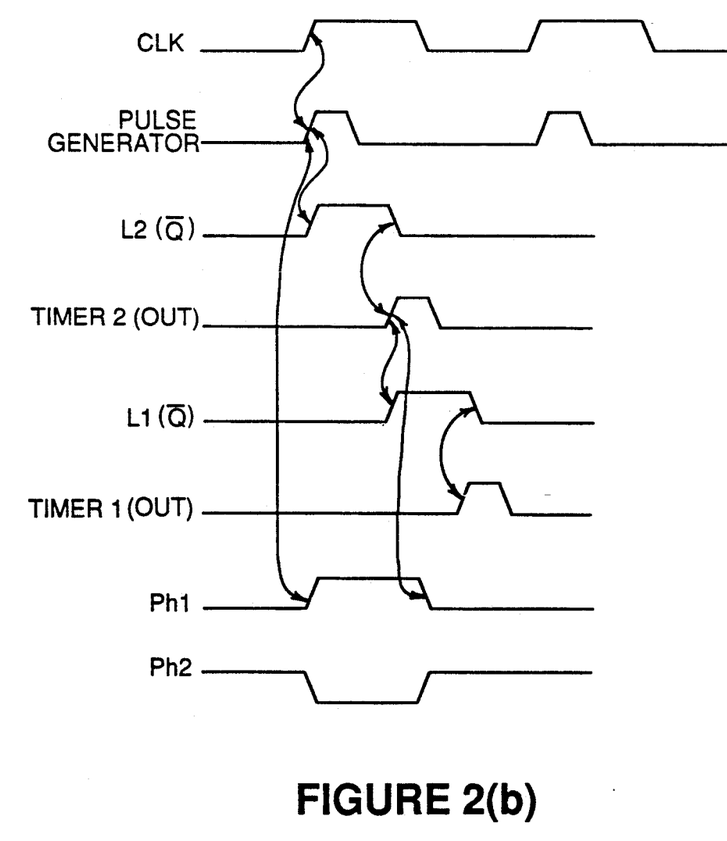
FIG. 2(b) illustrates a timing diagram useful in describing the operation of the circuit illustrated in FIG. 2(a).

In order to improve the accuracy of phase one and phase two clock pulses generated at the crystal oscillator frequency, a new circuit has been devised. This circuit 10 is illustrated in block diagram form in FIG. 2(a). The circuit 10 includes a one-shot pulse generator circuit 12 which receives input at the crystal oscillator frequency and provides an output pulse timed off of the rising edge of the clock pulse. The input signals to and the output signals from the pulse generator circuit 12 are illustrated in FIG. 2(b). The pulses provided by the pulse generator circuit 12 on an output line 13 are furnished to the reset terminal of a flip-flop 14. The flip-flop 14 provides the phase one and phase two output pulses at the frequency of the input crystal oscillator at its Q and $\overline{Q}$ output terminals, respectfully. When the input pulse from the pulse generator 12 is received at the reset terminal of the flip-flop 14, the $\overline{Q}$ terminal goes high and the Q terminal goes low.

The pulse from the pulse generator circuit 12 is also furnished to the reset terminal of a flip-flop 16 causing the $\overline{Q}$ terminal of that flip-flop 16 to go high and provide input to a first timer circuit 17. After a prescribed delay, the timer circuit 17 provides an output pulse which is furnished to a set terminal of the flip-flop 16, to the set terminal of the flip-flop 14, and to a reset terminal of a flip-flop 18.

The pulse from the first timer 17 sets the flip-flop 14, causing its $\overline{Q}$ terminal to go low and its Q terminal to go high. This determines the length of the positive-going portion (the duty cycle) of the phase one clock pulse and initiates the positive-going portion of the phase two clock pulse. At the same time, the same pulse from the timer 17 sets the flip-flop 16 thereby driving its $\overline{Q}$ terminal low and its Q terminal high. The pulse from the timer 17 also resets the flip-flop 18 driving its $\overline{Q}$ terminal high and its Q terminal low. The output of the $\overline{Q}$ terminal of the flip-flop 18 is provided as input to a second timer circuit 19 which after a prescribed delay furnishes an output to set the flip-flop 18 driving its $\overline{Q}$ terminal low and its Q terminal high.

During the operation of the circuit 10, the Q terminals of each of the flip-flops 16 and 18 are compared by a phase detector 21. The phase detector circuit 21 provides signals to a current mirror circuit 23 which furnishes signals on lines 24 and 25 for controlling the length of the phase one and phase two duty cycles. More particularly, if the Q terminals of both of the flip-flops 16 and 18 are high (see FIG. 2(b)), both of the flip-flops 16 and 18 will have been set. This means that the phase one and phase two pulses have both been completed, and that both timers 17 and 19 have timed out too soon so that the duty cycles are too short. To lengthen the output signals produced by the timers 17 and 19, the phase detector 21 provides signals to the current mirror 23 to cause it to generate signals on lines 24 and 25 for varying the length of the signals produced by each of the timers 17 and 19.

Alternatively, if at the time the pulse generator provides a pulse for resetting the flip-flop 16, the timer 19 has still not produced a pulse for setting the flip-flop 18, the two phase one and phase two pulses are too long; and the controlling timers 17 and 19 need to have their duty cycles shortened. This may be detected from the outputs at the Q terminals of the flip-flops 16 and 18 by the overlap of the high condition which causes the phase detector circuit 21 to provide signals to the current mirror 23 to cause it to generate signals on the lines 24 and 25 for shortening the delay provided by each of the timers 17 and 19.

In this manner, the two phase one and phase two pulses are affected by the feedback provided by the phase detector circuitry 21 to the timers 17 and 19 to accurately determine the lengths of the phase one and phase two pulses. The circuit 10 of FIG. 2 also includes a subharmonic detector circuit 26 which compares the frequency of the signals generated by the flip-flop 16 and the external clock signal and provides a signal for causing the phase detector circuit 21 to increase the frequency of operation of the circuit 10 by decreasing the timing intervals provided by the timers 17 and 19 so that the circuit 10 cannot operate at a subharmonic frequency.

Figure 3A:
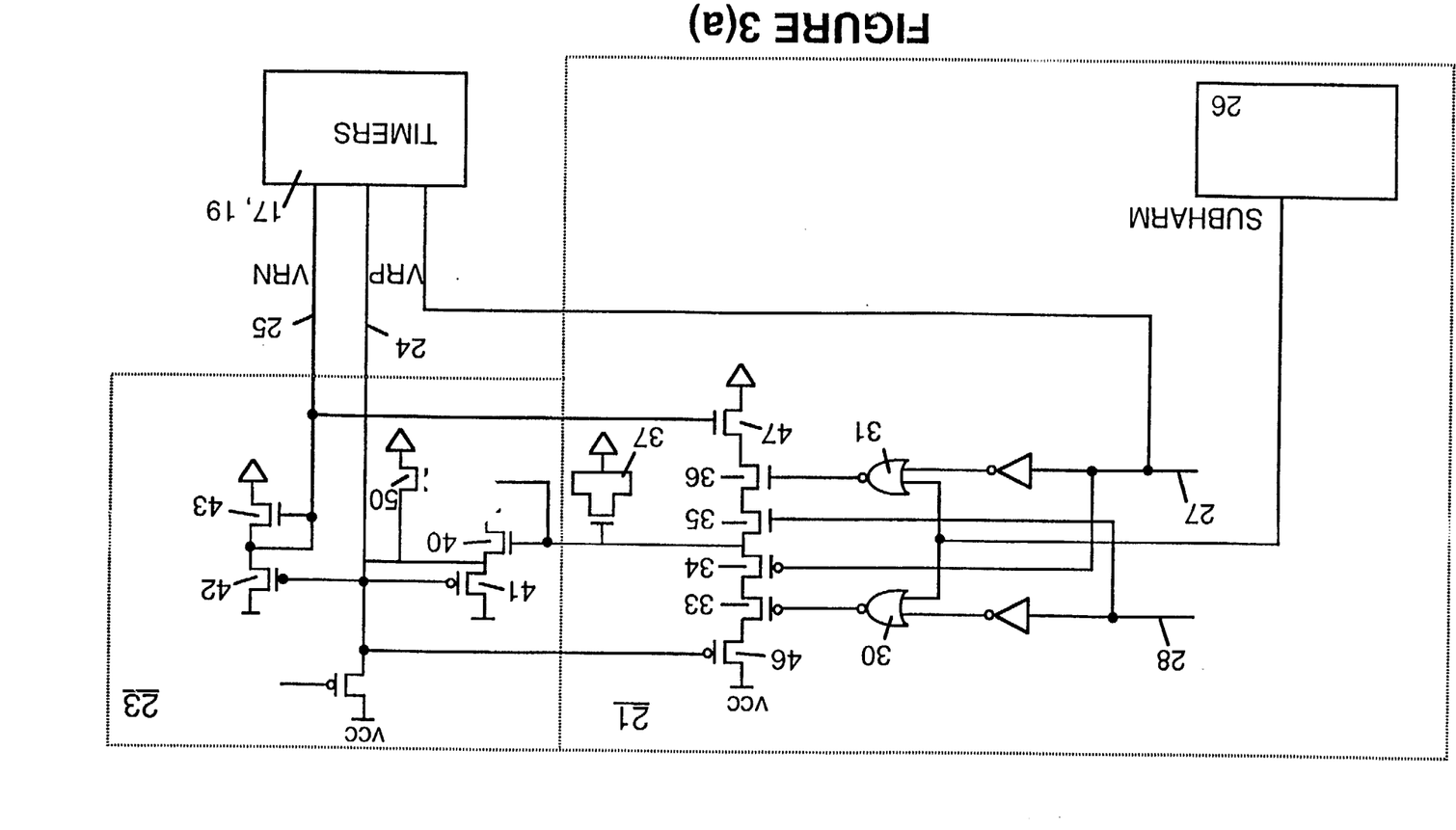
FIG. 3(a) and (b) are circuit diagram illustrating in more detail the circuitry for implementing the arrangement shown in the block diagram in FIG. 2.

FIG. 3(a) illustrates in more detail the circuitry of the phase detector 21 and the current mirror 23 for implementing the arrangement 10 shown in the block diagram in FIG. 2. The circuit 21 illustrated in FIG. 3(a) receives the signal generated at the Q terminal of the flip-flop 16 on a line 27. The phase detector 21 also receives input from a second flip-flop 18 on an input line 28 from the Q terminal of the flip-flop 18. Input signals on lines 27 and 28 to the phase detector 21 are transferred by NOR gates 31 and 30, respectively, to control the operation of a number of transistors. These transistor devices 33, 34, 35, and 36 are serially arranged between ground and $V_{CC}$ to provide a control voltage for charging or discharging a capacitor 37. The devices 33-36 are a series of field effect transistors (FETs). Field effect transistors 33 and 34 are P channel FETs while field effect transistors 35 and 36 are N channel FETs. Devices similarly illustrated in the drawing are similar in characteristics. A zero input value activates a P channel device and deactivates an N channel device; consequently, a high input value activates an N channel device and deactivates a P channel device.

The capacitor 37 provides the varying signals for controlling the duty cycle of each of the timer circuit 17 and the timer circuit 19 referred to in FIG. 2 and thereby precisely controls the length of duty cycles of the phase one and phase two pulses.

As may be seen, a signal on line 27, for example, is furnished to the gate of the P transistor 34 and a gate of the N transistor 36 while a signal on line 28 is furnished to the gate of the N transistor 35 and the gate of the P transistor 33. If the Q terminals of both of the flip-flops 16 and 18 are low, indicating that the duty cycle of the phase one and phase two pulses are too long, then the transistors 33 and 34 will be enabled causing the capacitor 37 to charge and provide a voltage to the current mirror circuit 23. This voltage is converted and transferred by the current mirror circuit 23 to the timer 17 and the timer 19 for varying the duty cycles thereof. Alternatively, if the Q terminals of the two flip-flops 16 and 18 are both high, the transistors 35 and 36 will be enabled providing a voltage to discharge of the capacitor 37. This voltage is converted and transferred by the current mirror circuit 23 to the timers 17 and 19 for lengthening the duty cycles thereof.

The current mirroring section 23 includes a first N device 40, a second P device 41, a third P device 42, and another N device 43. Current mirroring is utilized in order to generate a constant current which is independent of the drain to source voltage of the transistors involved. Consequently, changing the voltage at the output nodes of the current mirror 23 has very little effect on the current through the current mirror 23.

The device 40 is an N transistor which generates a current that is proportional to the control voltage on the capacitor 37. Although the current through the device 40 is somewhat non-linear, once current is established in device 40, if that current is passed through the P device 41 to generate a reference voltage $V_{RP}$ which is applied to the gate of the P transistor 42 connected to the same supply voltage, then the gate-to-source voltage is the same on both of those transistors 41 and 42 so the current through the devices 41 and 42 is the same. Thus, a current may be established in device 40 and an identical current flow mirrored through the transistor 41, and then to transistor 42.

The devices 40 and 41 are connected to the gate of a P device 46 connected between $V_{CC}$ and the P devices 33-36. The current mirror 23 provides the voltage $V_{RP}$ at the gate of the device 46 so that a constant charging current is provided from $V_{CC}$ when the devices 33 and 34 are enabled for charging the capacitor 37. In like manner, the devices 42 and 43 in the current mirror 23 are connected to the gate of an N device 47 positioned between ground and the N devices 35 and 36 to provide a constant charging current through the device 47 to ground for discharging the capacitor 37. In this manner, the charging rate for the capacitor 37, either from $V_{CC}$ or from ground, remains constant and is not a function of the transistor characteristics of the devices 46 and 47.

The current mirror 23 also includes a P device 50 which is utilized for producing a current during the turn-on time of the circuit of this invention.

Figure 3B:
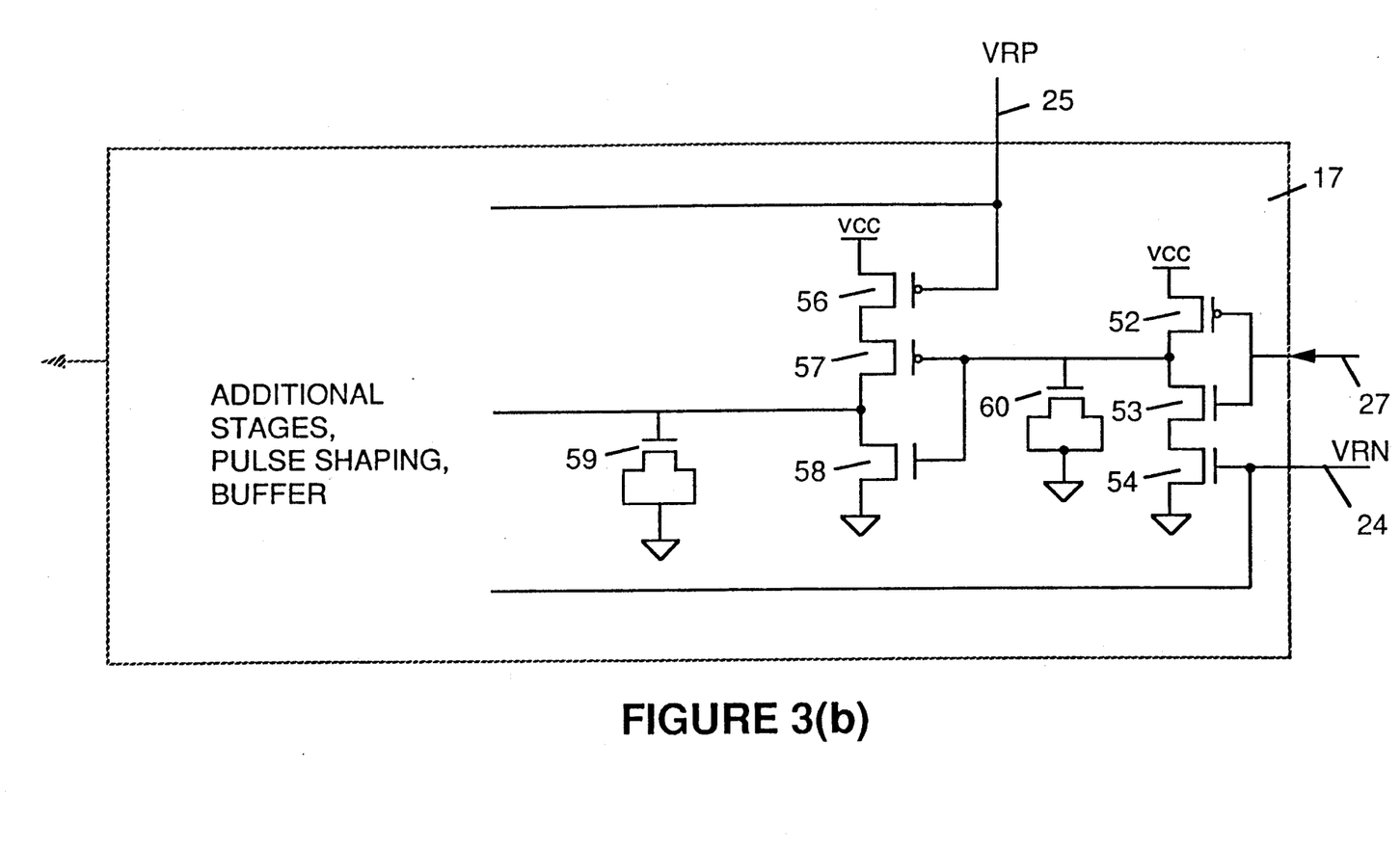

The reference voltages $V_{RP}$ and $V_{RN}$ in the current mirror 23 are applied via lines 24 and 25 to transistors in the timer circuits 17 and 19. FIG. 3(b) illustrates circuit 17, one of these two identical timing circuits. The circuit 17 includes a number of stages of delay (four in the preferred embodiment), a Schmitt trigger stage for shaping the output pulse, and a buffer output stage. The first stage of delay includes a P device 52, an N device 53, and an N device 54 arranged as a current mirror with the devices 42 and 43. The second stage includes a P device 56 arranged as a current mirror with the devices 40 and 41 of the current mirror 23, a P device 57, and an N device 58. The gate of the device 54 is connected to the input line 25 to receive the voltage $V_{RN}$ while the gate of the device 56 is connected to the line 24 to receive the voltage $V_{RP}$.

Thus, the current in the drains of the devices 54 and 56 which are also connected as current mirrors is exactly proportional to the currents in device 41 and ultimately in device 40. If the control voltage on the capacitor 37 rises toward $V_{CC}$, the gate-to-source voltage on the device 40 rises, increasing the current through the device 40. This current increase is translated by the current mirror 23 to the timer circuits 17 and 19. Consequently, the current charging (and discharging) the capacitors 59 and 60 of the timing circuits increases. The duration of the delay provided by the timers 17 and 19 decreases by the same proportion that the current in device 40 increases since quicker charging of the capacitors causes the timers 17 and 19 to react more rapidly (the higher the current, the quicker the charge).

The reverse effect occurs if the voltage on the capacitor 37 is lowered toward ground. This lowers the current through the transistor 40 which is mirrored to the timer circuits 17 and 19, thereby decreasing the charging rate for charging and discharging of the timer capacitors 59 and 60 (and those of the similar later stages) and increasing the delay of the timer circuits 17 and 19.

Each stage of the timer 17 is similar to an inverter, only it has an additional current mirroring device connected to limit the charging current through the stage. So, the charging time for the capacitor is similar to a normal inverter charging time, a nanosecond or less in a preferred embodiment. The current in the discharge path of the capacitor of each stage of the timer 17 is limited by the current mirror transistor to discharge at a rate governed by the current in that transistor which was set up by the control voltage $V_{RP}$ or $V_{RN}$. Following each discharge stage is a charging stage. The first stage discharges slowly, the next stage sets up an inversion which charges slowly. This is repeated throughout the several stages.

Unfortunately, the circuit 10 as disclosed to this point can operate in a condition in which it produces subharmonic pulses for the two phase clock signals, pulses the frequency of which is just half that desired for operating the computer system. In order to obviate this possibility, a subharmonic detector circuit 26 is provided. The subharmonic detector 26 shown in FIG. 4 includes a one shot pulse generator circuit 62, a divide-by-two master-slave flip-flop 63, a pair of latches 67 and 68, and an exclusive OR circuit 69. The pulse generator 62 receives the same input as is provided to the one shot pulse generator 12. The pulse generator 62 includes an additional stage of delay and thus provides an output signal slightly after the pulse produced by the generator 12 as may be seen by the timing diagram of FIG. 5.

Figure 4:
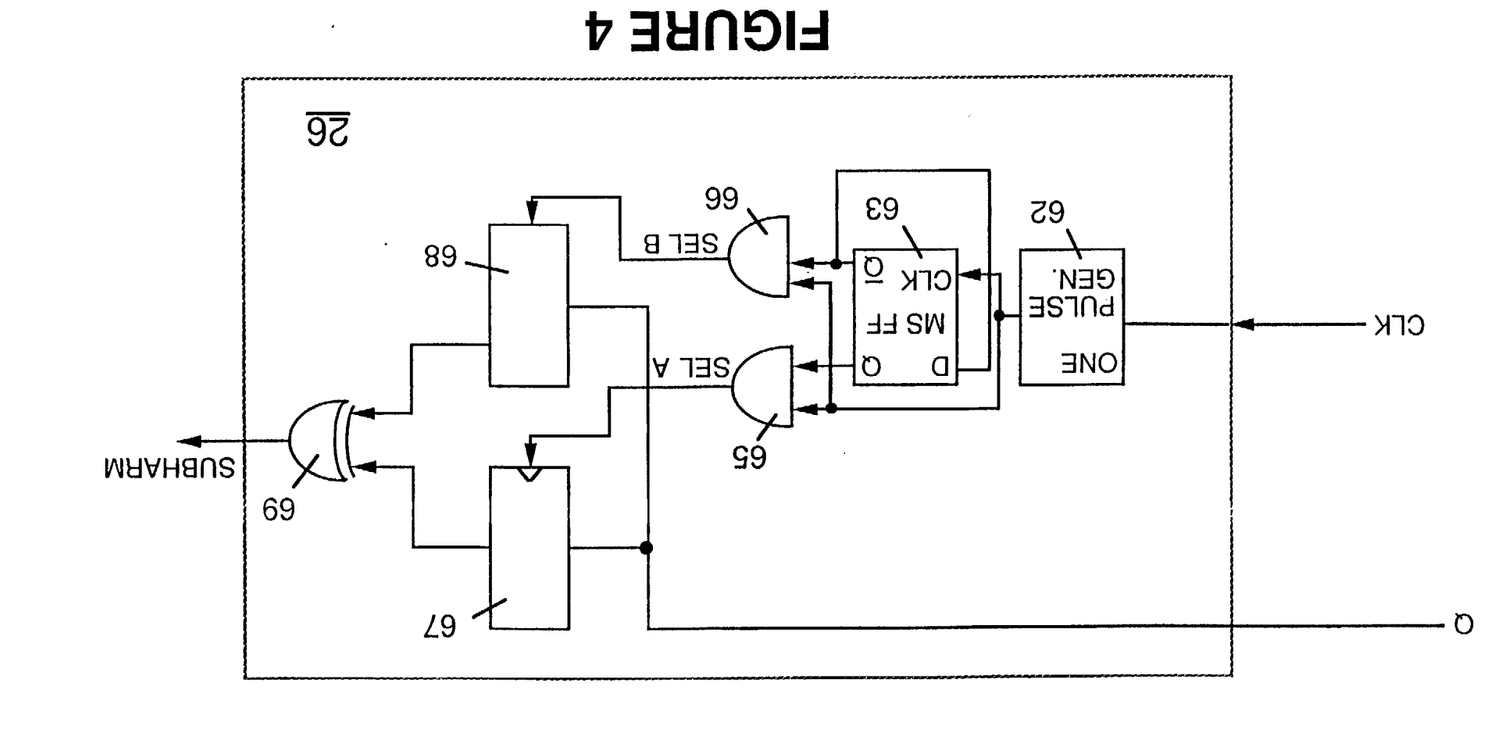
FIG. 4 illustrates a circuit in accordance with the invention which may be utilized to improve the accuracy of phase one and phase two clock pulses generated at a crystal oscillator frequency by eliminating the tendency to lock on a subharmonic frequency.

The output of the pulse generator 62 is furnished to the input of the divide-by-two flip-flop 63 which produces a high output on a first clock cycle and a low output on a next clock cycle. The high output of the flip-flop 63 is provided on alternate cycles to one or the other of a pair of AND gates 65 and 66. The AND gates 65 and 66 each also receive an input signal from the one shot pulse generator 62. Each of the AND gates 65 and 66, consequently, produces an output only on alternate clock cycles. These output signals are furnished as enabling inputs to latches 67 and 68. The latches 67 and 68 also receive an input signal from the Q terminal of the flip-flop 16. The condition of the Q terminal of the flip-flop 16 changes with the internal clock signal being generated and thus reflects whether that signal is a subharmonic of the desired clock.

The outputs of the latches 67 and 68 are provided to an exclusive OR gate 69. If the two inputs to the exclusive OR gate 69 are the same, no output is produced by the exclusive OR gate 69. This is the result when phase one and phase two clock pulses of proper frequency are being produced. If the two inputs are different, this indicates that the two out-of-phase clocks are locked into a subharmonic frequency; and the exclusive OR gate 69 produces an output pulse.

Figure 5:
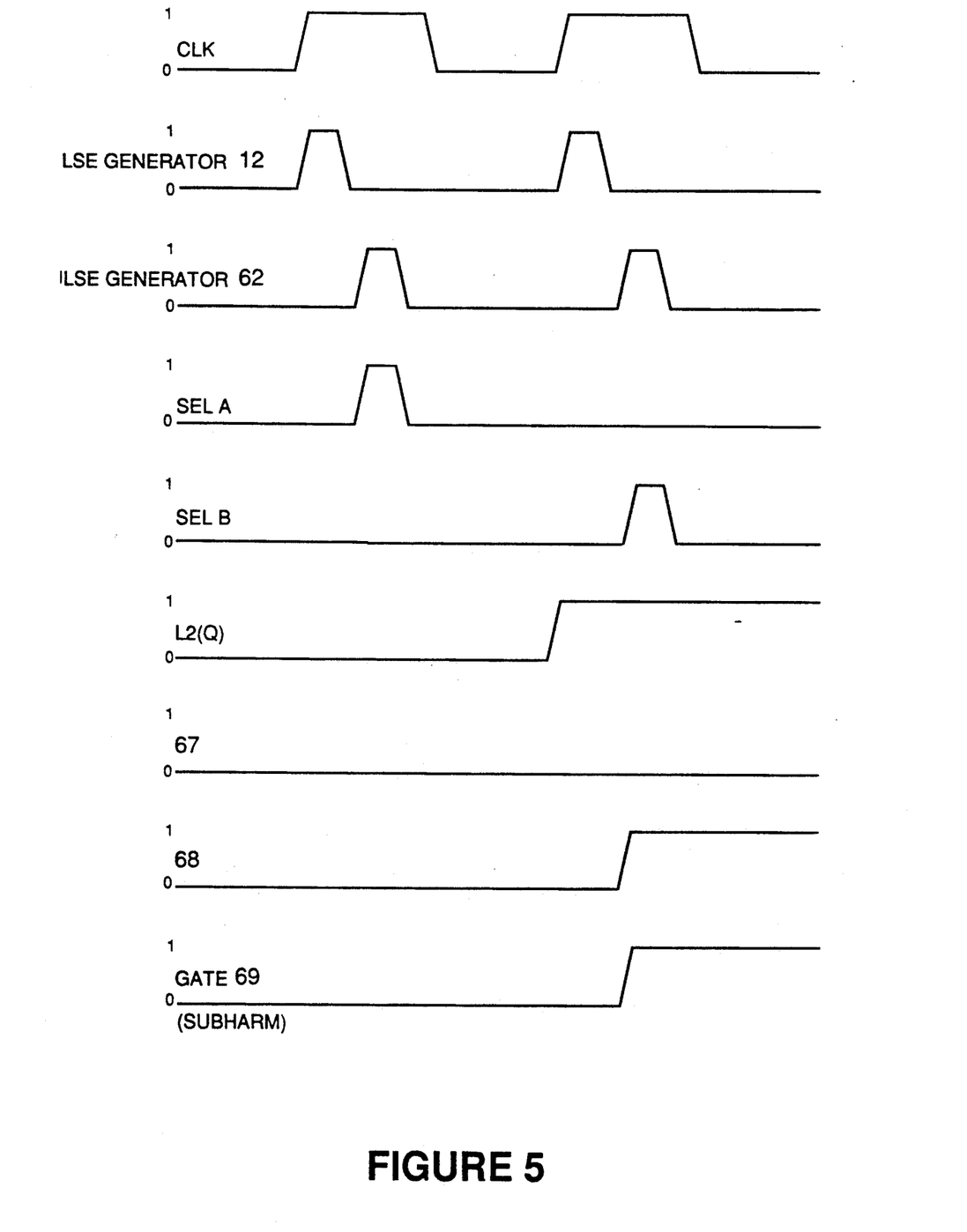
FIG. 5 illustrates a timing diagram useful in understanding the operation of the circuit of FIG. 4.

The timing diagram of FIG. 5 illustrates the operation of the subharmonic detector circuit 26. As may be seen, the output of the one-shot pulse generator 62 and the two outputs of the flip-flop 63 are applied to the NAND gates 65 and 66 at the input to the latches 67 and 68. The subharmonic lock frequency from flip-flop 16 is also furnished. Since this signal alternates high and low while the outputs from the flip-flop 63 are at half frequency, the input to the latches will only occur every other cycle. If the circuit of the invention is operating properly at the correct frequency, the latches will remain in the same condition since the signal from the flip-flop 16 never goes high during the time the latches 67 and 68 are enabled. If, on the other hand, the circuit of the invention is at a subharmonic frequency, the latches will change when the signal from the flip-flop 16 goes high during the time the latches 67 and 68 are enabled. When the select B signal goes high, the latch 68 goes high causing the exclusive OR circuit 69 to furnish an input to turn on the devices 33 and 34 to charge the capacitor 37 and increase the frequency of operation.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for generating a pair of opposite phase clock pulses at a frequency equal to an input frequency comprising a first flip-flop having first and second input terminals for producing the opposite phase clock pulses, means for furnishing pulses at the input frequency to one input terminal of the first flip-flop, a second flip-flop having first and second input terminals, means for furnishing pulses at the input frequency to one input terminal of the second flip-flop, a first timing circuit responsive to an output of the second flip-flop for initiating a timing sequence to provide a signal furnishing a second input to the second flip-flop and a second input to the first flip-flop, a third flip-flop having first and second input terminals, means for providing the signal furnishing a second input to the second flip-flop to the first terminal of the third flip-flop, a second timing circuit responsive to an output of the third flip-flop for initiating a timing sequence to provide a signal furnishing a second input to the third flip-flop, means for comparing the length of similar output signals produced by the second and third flip-flops and varying the lengths of the timing sequences to be equal, means for detecting a subharmonic of an output of the second flip-flop and the input frequency to detect a subharmonic of the input frequency, and means responsive to the detection of a subharmonic of the input frequency for causing the means for comparing the similar output signals produced by the second and third flip-flops and varying the lengths of the timing sequences to be equal to vary the the lengths of the timing sequences to increase the frequency of output produced by the first flip-flop.

2. A circuit for generating a pair of opposite phase clock pulses at a frequency equal to an input frequency as claimed in claim 1 in which the means for comparing the length of similar output signals produced by the second and third flip-flops and varying the lengths of the timing sequences to be equal comprises means for storing a charge for controlling voltage levels provided to the first and second timing circuits, means for reducing the charge stored by the means for storing a charge if duty cycles of the timing circuits are too long, and means for increasing the charge stored by the means for storing a charge if the cycles of the timing circuits are too short.

3. A circuit for generating a pair of opposite phase clock pulses at a frequency equal to an input frequency as claimed in claim 2 in which the means for comparing the length of similar output signals produced by the second and third flip-flops and varying the lengths of the timing sequences to be equal further comprises means for comparing the signal levels at the output terminals of the second and third flip-flops to control the charging and discharging of the means for storing a charge for controlling voltage levels provided to the first and second timing circuits.

4. A circuit for generating a pair of opposite phase clock pulses at a frequency equal to an input frequency as claimed in claim 3 in which the means for detecting a subharmonic of the input frequency comprises means for comparing the condition of an output of the second flip-flop on succeeding clock pulses, and means for producing an output to signal a subharmonic frequency.

5. A circuit for generating a pair of opposite phase clock pulses at a frequency equal to an input frequency as claimed in claim 4 in which the means for comparing the condition of an output of the second flip-flop on succeeding clock pulses comprises first and second means for storing the condition of the output of the second flip-flop, means for enabling each of the means for storing to produce an output on succeeding clock pulses, and means for producing an output when only a single means for storing the condition of the output of the second flip-flop produces an output.

6. A circuit for generating a pair of opposite phase clock pulses at a frequency equal to an input frequency as claimed in claim 5 in which the means responsive to the detection of a subharmonic of the input frequency for causing the means for comparing the similar output signals produced by the second and third flip-flops and varying the lengths of the timing sequences to be equal to vary lengths of the timing sequences to increase the frequency of output produced by the first flip-flop comprises means for activating the means for increasing the charge stored by the means for storing a charge for controlling voltage levels provided to the first and second timing circuits.

7. A circuit for generating two clock pulse trains of opposite polarity to one another at a frequency of a single input clock pulse train comprising first flip-flop means for providing the two output clock pulse trains, means for generating signals from the input clock pulse train to place the first flip-flop means in a first condition, second flip-flop means responsive to the signals from the means for generating signals for providing two clock pulse trains similar to the two clock pulse trains provided by the first flip-flop means, means for producing signals delayed by a first period to place the first flip-flop means and the second flip-flop means in a second condition in response to signals from one of the two clock pulse trains produced by the second flip-flop, third flip-flop means responsive to the signals delayed by a first period for providing two clock pulse trains, means for producing signals delayed by a second period to place the third flip-flop means in a second condition, means for comparing the length of pulses from one of the two clock pulse trains produced by the second flip-flop means with the length of pulses from one of the two clock pulse trains produced by the third flip-flop means to make the first and second periods equal, means for measuring an output of the second flip-flop means and input clock pulse train to detect a subharmonic of input clock pulse train, and means responsive to the detection of a subharmonic of input clock pulse train for causing the means for comparing the length of pulses from one of the two clock pulse trains produced by the second flip-flop means with the length of pulses from one of the two clock pulse trains produced by the third flip-flop means to make the first and second periods equal to vary lengths of timing sequences of the means for producing signals delayed by the first and second periods, respectively to increase the frequency of the clock pulse trains produced by the first flip-flop means.

* * * * *

UNITED STATES PATENT AND TRADEMARK OFFICE
CERTIFICATE OF CORRECTION

PATENT NO. : 5,079,440

DATED : January 7, 1992

INVENTOR(S) : Ben roberts & Borys Senyk

It is certified that error appears in the above-identified patent and that said Letters Patent is hereby corrected as shown below:

Add the drawing sheets, consisting of Figs. 3a and 4 as shown on the attached pages.

Signed and Sealed this

Twenty-seventh Day of June, 1995

*Attest:*

BRUCE LEHMAN

*Attesting Officer*     *Commissioner of Patents and Trademarks*

FIGURE 3(a)

FIGURE 4